United States Patent [19]
Buixadera Ferrer

[11] Patent Number: 6,014,805
[45] Date of Patent: Jan. 18, 2000

[54] METHOD OF FABRICATING A HYBRID PRINTED CIRCUIT BOARD

[75] Inventor: Joan Maria Buixadera Ferrer, Valls, Spain

[73] Assignee: Lear Automotive Dearborn, Inc., Southfield, Mich.

[21] Appl. No.: 08/960,473

[22] Filed: Oct. 29, 1997

[51] Int. Cl.[7] .................................................. H01K 3/10
[52] U.S. Cl. .............................. 29/852; 29/846; 216/13; 216/17; 216/18; 216/41; 427/58; 427/256; 427/282; 427/331
[58] Field of Search ........................... 29/846, 847, 852, 29/853; 427/58, 96, 97, 98, 256, 282, 331, 337, 352; 216/13, 17, 18, 19, 20, 41

[56] References Cited

U.S. PATENT DOCUMENTS

| | | | |
|---|---|---|---|
| 4,569,720 | 2/1986 | Schmitkons et al. | 156/646 |
| 5,089,361 | 2/1992 | Huang | 430/5 |
| 5,389,270 | 2/1995 | Thorn et al. | 252/22 |
| 5,603,848 | 2/1997 | Beratan et al. | 216/17 |
| 5,676,855 | 10/1997 | Schulz-Harder | 216/52 |
| 5,718,039 | 2/1998 | Saida et al. | 29/846 |

*Primary Examiner*—Lee Young
*Assistant Examiner*—Kevin G. Vereene
*Attorney, Agent, or Firm*—Brooks & Kushman P.C.

[57] ABSTRACT

A method of fabricating a hybrid printed circuit board on a dielectric substrate is disclosed. The method comprises the step of masking a first pattern on a first side of the dielectric substrate, and masking a second side of the dielectric layer. Subsequently, the first side of the dielectric layer is etched to form a first conductive pattern. Thereafter, a second pattern is masked on the second side of the dielectric substrate, while masking the first side of the dielectric layer. With the second pattern masked on the second side of the dielectric layer and the and the first side masked, an etching step if performed on the second side of the dielectric layer to form a second conductive pattern.

14 Claims, 2 Drawing Sheets

METHOD OF FABRICATING A HYBRID PRINTED CIRCUIT BOARD

FOREIGN PRIORITY APPLICATION

The present application claims priority, under 35 U.S.C. §119, from a commonly assigned Spanish Patent Application, Number P9602286, filed on Oct. 29, 1996.

FIELD OF THE INVENTION

This invention relates to hybrid printed circuit boards, generally, and more particularly to a method for fabricating a hybrid printed circuit board on substrate for conducting power signals on one face of the substrate and data signals on the other face.

BACKGROUND OF THE INVENTION

Electronic content in automobiles has been growing over the last decade. Controls, switches, and electronic functions are now incorporated within the vehicle offering a selection of a variety of additional features. Proportionate to the growth in electronics, the number and complexity of wire harnesses for connecting the controls to the vehicular systems has also increased, as have the number of parallel connections therebetween.

One known industry approach for realizing parallel interconnections between controls is a junction box. Conventional service or junction boxes are well known in the art, particularly in the automobile industry. Centralizing the connections of the electrical system of automobiles, junction boxes provides support for the interconnections of various power lines, as well as for various components, including relays, electronic modules and connectors, for example. Prior to this centralization approach, connections were distributed totally or partially, at various points of the automobile.

With the increased electronic content of automobiles, however, there has been a movement within the automotive to further integrate more features and enhance the capability of the junction box. This effort has been focused on developing a printed circuit board ("PCB") having a centralized controller to monitor and control an automobile's features and functions. One outstanding problem in realizing this goal has been finding a method for fabricating a PCB which conducts power signals to power all functional elements, as well as data signals to control all functional elements.

SUMMARY OF THE INVENTION

The primary advantage of the present invention is to overcome the limitations of the prior art.

A method is detailed herein for fabricating a hybrid printed circuit board formed on a substrate having two conductive layers with preferably widths of 400 microns and 35 microns, positioned superjacent and subjacent to the substrate. The fabrication process begins with a previous machining of the dielectric support by a conventional drilling operation, programmed according to the final design of the printed circuit, followed by a graphite deposition in the holes earlier produced, to be followed by a printing with ink of the negative of the circuit, and following that it is submitted to the metallization by electrolytic copper and later protection of the positive by a blend of Sn and Pb.

The present invention consists of novel characteristics of construction, conformation and design, fulfill the purpose for which it has been specifically projected with a maximum of safety end efficiency.

It is generally understood that printed circuit boards comprise a substrate or plate of a mainly insulating material which functionally serves as support for electric or electronic components, and over which a thin coat of conductive material, usually copper or aluminum, is formed in a way that it makes the necessary interconnections between the components, and thereby substituting for conventional wiring.

Construction of a printed circuit board begins with the insulating plate, generally comprised of Bakelite or another plastic material, over which a coat of conductive material, normally copper, is adhered. Formed superjacent this coat are conducting tracks or traces which are covered with some type of substance which resists acids or bases according to a pattern. In this way, by chemical attack, the unwanted remainder of the conducting material may be removed.

Subsequently, a simple machining step is performed. Here, the plate is drilled at predetermined points to enable connection wires and components to pass through. Once positioned within these holes, a welding operation is performed. This step can be undertaken submerging the plate in a tin bath.

Utilizing acids or bases, once unwanted conducting material is removed by chemical attack to formulate the necessary conductive tracks or traces, the hybrid printed circuit board is passed through a tunnel machine. The tunnel machine has a series of upper and lower showers designed specifically for printed circuit boards having two conductive faces, i.e., with a conducting coat on both sides of the dielectric substrate.

In Spanish Patent No. 9 200 325, commonly assigned with the present application, a service or junction box is disclosed comprising printed circuit boards having several characteristics to serve as a support of control electronic components and to electro-electronic power components, as detailed in the Spanish Patent No. 9 500 446 (7), also commonly assigned with the present application. In order to optimize double sided printed circuit boards, a first conductive side or face, preferably comprised of copper, must be incorporated with a thickness of approximately 35 micron for data signals, and on the other side, a second conductive face also preferably comprise of copper, having a thickness of 400 micron for power signals.

In actual production, the processes contemplated utilize machines which obtain either a thickness of 17 to 105 microns or a thickness of 105 to 400 microns. However, for hybrid printed circuit boards, the first face must comprises a thickness of 17 to 105 micron, while the second must comprise a thickness of 105 to 400 micron. The difficulty in achieving both intended thicknesses is that these processes are based in chemical attack or etching. Additionally, the time necessary to etch a pattern onto a 400 micron thick layer is approximately eleven times greater than that for a 35 micron layer. Moreover, while machines are available to suitably dimension each layer thickness individually, machines currently are unable to perform two sided printed circuit boards having two thicknesses as distinctive as in the present case, even if such a machine were to stop the upper shower part of the aforementioned tunnel machine.

In view of the shortcomings with respect to different speeds and and the requirement of obtaining printed circuit boards having two thicknesses of 35 and 400 micron, respectively, a new method has been developed which joins the two basic process steps of engraving and incorporating a new protective layer with ink. This step of incorporating a protection layer includes applying ink on the face of the 35 micron layer to avoid that unwanted etching during the engraving of the 400 micron layer.

In order to achieve the advantages of the present invention, a method of fabricating a hybrid printed circuit board on a dielectric substrate is disclosed. The method initially comprises the step of masking a first pattern on a first side of the dielectric substrate. A general mask is then applied to the second side of the dielectric layer. The first side of the dielectric layer is subsequently etched to form a first conductive pattern all while maintaining the integrity of the second side of the dielectric layer. Thereafter, a second pattern is masked onto the second side of the dielectric substrate, and a general mask is applied onto the first side of the dielectric layer. At this point, the second side of the dielectric layer is etched to form a second conductive pattern while also maintaining the integrity of the first side of the dielectric layer.

In a further embodiment of the present invention, a hybrid printed circuit board is disclosed for conducting data and power signals. The hybrid printed circuit board comprises a dielectric substrate. The hybrid printed circuit board moreover comprises a first conductive layer for conducting data signals. The first conductive layer is formed superjacent a first side of the dielectric substrate and comprises a thickness greater than 5 micron. Furthermore, the hybrid printed circuit board also comprises a second conductive layer for conducting power signals which is formed superjacent a second side of the dielectric substrate and comprises a thickness greater than 100 micron.

In still a further embodiment of the present invention, a method of fabricating a hybrid printed circuit board is disclosed. The hybrid printed circuit board functionally conducts data signals through a first conductive layer superjacent a first side of a dielectric substrate, and power signals through a second conductive layer superjacent a second side of the dielectric substrate. The method of fabricating the hybrid printed circuit board initially comprises the step of masking a first circuit layout on the first conductive side of the dielectric substrate, while masking the second conductive side of the dielectric layer. Subsequently, the first conductive side of the dielectric layer is etched to form a first conductive trace pattern. During this step, the integrity of the second conductive side of the dielectric layer is maintained due to the mask as applied to the second conductive side of the dielectric layer. Upon completing the etch step, the masks from the second conductive side of the dielectric layer and from the first conductive trace pattern are removed. Thereafter, a second pattern is masked onto the second conductive side of the dielectric substrate, and the first side of the dielectric layer is also masked. Subsequently, the second conductive side of the dielectric layer is etched to form a second conductive trace pattern. The integrity of the first conductive side of the dielectric layer is again maintained because of the mask applied to the first conductive side of the dielectric layer. Finally, the masks from the first conductive side of the dielectric layer and from the first conductive trace pattern are removed.

These and other details, features, advantages and objects will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENT

With respect to a generalized process flow according to the present invention, certain defined steps are incorporated herein. These include the step of engraving; pickling with ink; soldering masks between tracks; soldering mask operation; serigraphy of components; drilling operation; passivating; depositing graphite; printing with ink; metallizing; protecting with tin-lead; ink cleaning; depanaling the printed circuit board division; passivating or applying tin; pickling; and inking.

In the preferred embodiment of the present invention, in fabricating a hybrid printed circuit board having two conductive layers with thicknesses of 400 and 35 microns, respectively, the process begins with a previous mechanizing of the dielectric support by a conventional drilling operation programmed accordingly to the final design of the printed circuit. Subsequently, a graphite deposition step is applied over the previously made holes, and an ink printing step is performed of a negative circuit pattern layout. Thereafter, a metallizing step by electrolytic copper is exercised and protective step is employed by utilizing the positive portion with a blend of Sn/Pb by pickling.

With the help of suitable containers, the ink is washed, an engraving step is performed on the 35 micron face of the printed circuit board which is then protected with ink. Subsequently, the 400 micron face of the printed circuit board is engraved, the ink is washed and a pickling step of Sn/Pb is performed. Thereafter, the operation of a solder mask of the inter-track by means of a photosensitive screen is performed.

Figures 1A, 1B:
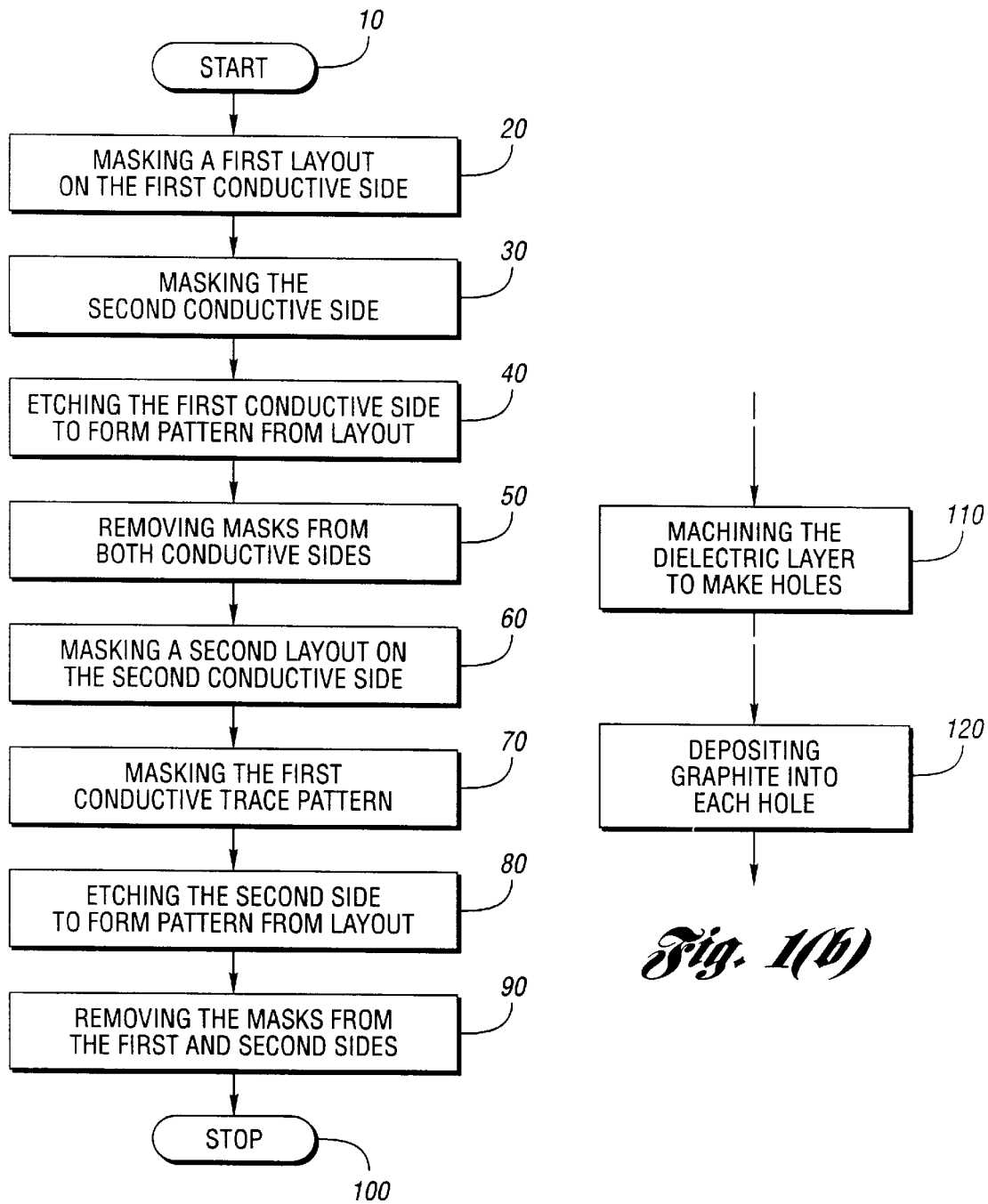
FIGS. 1(a) and 1(b) illustrate flow charts for fabricating a hybrid printed circuit board according to the present invention.

Referring to FIG. 1(a), a flow chart is depicted according to the present invention. The flow chart illustrates the process step in fabricating a hybrid printed circuit board from a dielectric substrate having a first conductive layer superjacent and a second conductive layer subjacent. Initially, a first circuit layout is masked on the first conductive side superjacent the dielectric substrate (MASKING 20). After masking the first conductive side according to a first circuit layout, the second conductive side subjacent the dielectric substrate is masked (MASKING 30). Thereafter, the dielectric substrate is placed into an etch bath so as to form a first conductive trace pattern (ETCHING 40). During this step, it should be apparent to one of ordinary skill in the art that the second conductive side is masked previously to maintain the integrity of the second side during the etching step for subsequent processing. Upon completing the etching step of the first conductive side to form a first conductive trace pattern, the masks positioned over the first and second conductive sides are then removed (REMOVING 50).

With a first conductive trace pattern formed and the second conductive side of subjacent the dielectric layer remaining intact, a second circuit layout is masked on the second conductive side subjacent the dielectric substrate (MASKING 60). Then, a further masking step (MASKING 70) is executed over the first conductive trace pattern to insure its integrity against a subsequent etching step. With both conductive sides of the dielectric layer masked, the substrate is positioned within an etching solution (ETCHING 80) so as to formulate a second conductive trace pattern on the second conductive side of the dielectric substrate. Thereafter, the masks on both first and second conductive side are removed (REMOVING 90) to create a hybrid printed circuit board having a first conductive trace pattern superjacent the dielectric substrate and a second conductive trace pattern subjacent the dielectric substrate. It should be apparent to one of ordinary skill in the art that either the first or second conductive side comprises a thickness of 10 to 105 microns, while the opposite conductive side comprises a thickness of 105 to 500 microns.

Referring to FIG. 1(b), a supplemental flow chart is depicted according to the present invention. The flow chart illustrates a two step process which is preferably added to the method detailed in FIG. 1(a) prior to the step of MASKING 20. Here, a machining step is performed on the dielectric layer to create a plurality of holes (MACHINING 110). Each hole is intended to provide an insertion point for an electronic device, electrical component or jumper wire. Thereafter, graphite or some such substance with similar characteristics is deposited (DEPOSITED 120) into each hole of the plurality of holes created. It should be apparent to one of ordinary skill in the art that the two step process detailed within FIG. 1(b) may be alternatively executed at various points within the method depicted in the flow chart of FIG. 1(a).

Figure 2A:
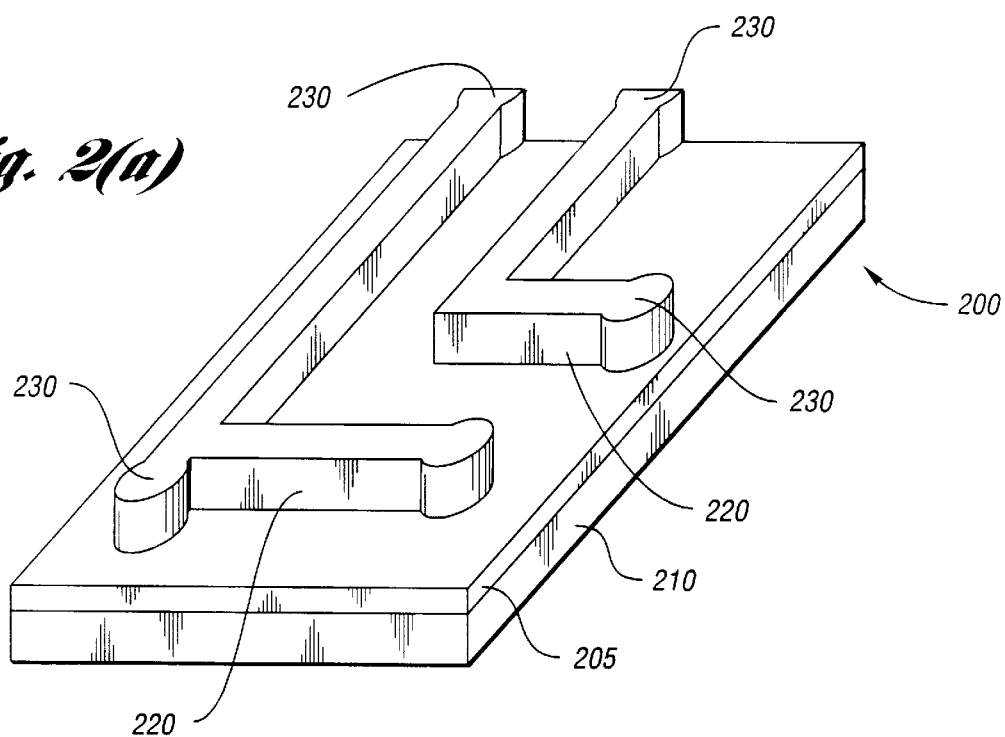
FIGS. 2(a) and 2(b) illustrate a hybrid printed circuit board structure according to the present invention.

Referring to FIG. 2(a), a perspective view of a first conductive side of a hybrid printed circuit board 200 is illustrated. Hybrid printed circuit board 200 comprises a dielectric substrate 205. From the perspective provided in FIG. 2(a), a first conductive trace pattern 220 is formed superjacent dielectric substrate 205, while a second conductive trace pattern 210 is formed subjacent dielectric substrate 205. First conductive trace pattern 220 comprises a thickness substantially in the range of 105 to 500 microns to conduct power signals. Moreover, first conductive trace pattern 220 is realized by the series of steps detailed in the method described hereinabove. Conductive trace pattern 220 comprises a plurality of holes 230. Holes 230 are formed at various positions on the conductive trace pattern 220.

Figure 2B:
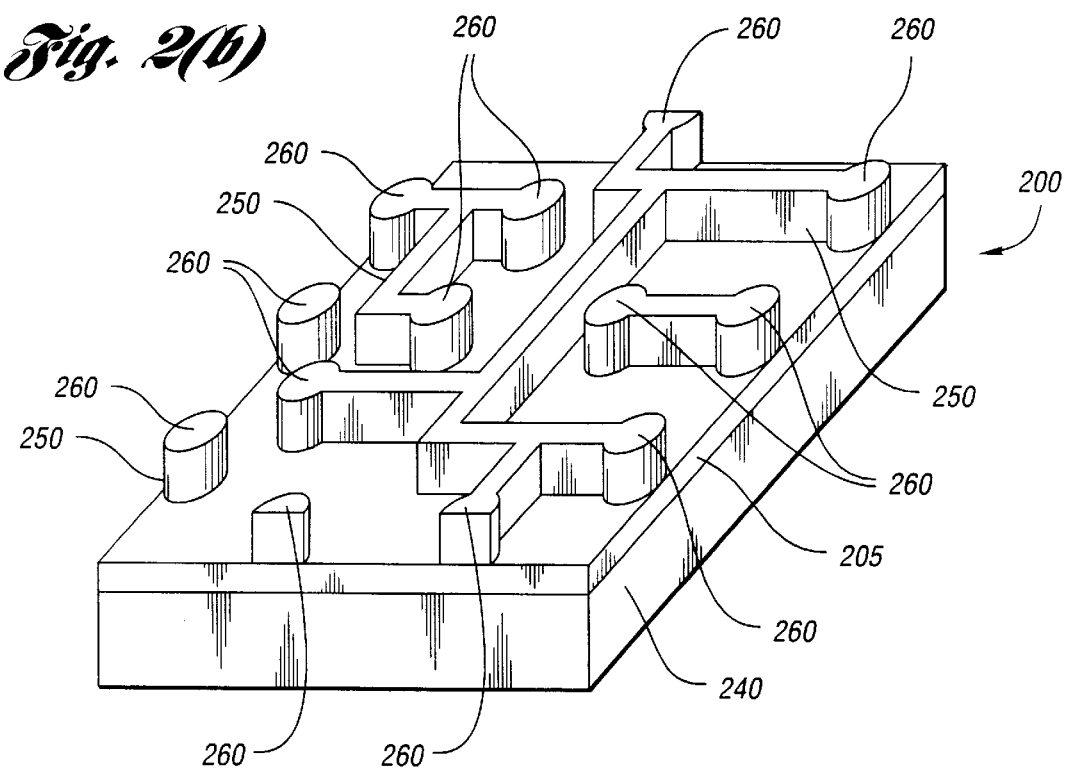

Referring to FIG. 2(b), a perspective view of a second conductive side of a hybrid printed circuit board 200 is illustrated. As in FIG. 2(a), hybrid printed circuit board 200 comprises a dielectric substrate 205. From the perspective provided in FIG. 2(b), a second conductive trace pattern 250 is formed superjacent dielectric substrate 205, while a first conductive trace pattern 240 is formed subjacent dielectric substrate 205. Second conductive trace pattern 250 comprises a thickness substantially in the range of 10 to 105 microns to enable various data signals to be conducted. Similarly, second conductive trace pattern 250 is realized by the series of steps detailed in the method described hereinabove. Conductive trace pattern 250 comprises a plurality of holes 260. Holes 260 are formed at various positions on the conductive trace pattern 250.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

What is claimed is:

1. A method of fabricating a hybrid printed circuit board on a dielectric substrate, the method comprising the steps of:
    masking a first pattern on a first side of the dielectric substrate;
    masking a second side of the dielectric layer;
    etching said first side of the dielectric layer to form a first conductive pattern while maintaining the integrity of said second side of the dielectric layer;
    removing the mask from said second side of the dielectric layer and from said first conductive pattern;
        then 1) masking a second pattern on said second side of the dielectric substrate;
        2) masking said first side of the dielectric layer;
        then 3) etching said second side of the dielectric layer to form a second conductive pattern while maintaining the integrity of said first side of the dielectric layer; and
    removing the mask from first side of the dielectric layer and from said second conductive pattern.

2. The method of claim 1, further comprising the steps of:
    machining the dielectric layer to form a plurality of holes; and
    depositing graphite in each hole of said plurality.

3. The method of claim 1, wherein at least one of said first and second sides of the dielectric layer comprise at least one of aluminum, copper and a composite conductive material.

4. The method of claim 3, wherein said composite conductive material comprises at least one of Sn and Pb.

5. The method of claim 1, wherein said first side of the dielectric layer has a thickness greater than 100 microns.

6. The method of claim 1, wherein said second side of the dielectric layer has a thickness greater than 5 microns.

7. A method of fabricating a hybrid printed circuit board on a dielectric substrate having a first conductive side having a thickness greater than of 100 microns and a second conductive side having a thickness greater than 5 micron, the method comprising the steps of:
    masking a first circuit layout on the first conductive side of the dielectric substrate;
    masking the second conductive side of the dielectric layer;
    etching the first conductive side of the dielectric layer to form a first conductive trace pattern while maintaining the integrity of the second conductive side of the dielectric layer;
    removing said mask from the second conductive side of the dielectric layer and from the first conductive trace pattern;
        then 1) masking a second pattern on the second conductive side of the dielectric substrate;
        2) masking the first side of the dielectric layer;
        then 3) etching the second conductive side of the dielectric layer to form a second conductive trace pattern while maintaining the integrity of the first conductive side of the dielectric layer; and
    removing said mask from the first conductive side of the dielectric layer and from the first conductive trace pattern.

8. The method of claim 7, further comprising the steps of:

machining the dielectric layer to form a plurality of holes; and depositing graphite in each hole of said plurality.

9. The method of claim 7, wherein at least one of the first and second conductive sides of the dielectric layer comprise at least one of aluminum, copper and a composite conductive material.

10. The method of claim 9, wherein said composite conductive material comprises at least one of Sn and Pb.

11. A method of fabricating a hybrid printed circuit board, the hybrid printed circuit board conducting data signals through a first conductive layer superjacent a first side of a dielectric substrate, and for conducting power signals through a second conductive layer superjacent a second side of the dielectric substrate, the method of fabricating the hybrid printed circuit board comprising:

masking a first circuit layout on the first conductive side of the dielectric substrate;

masking the second conductive side of the dielectric layer;

etching the first conductive side of the dielectric layer to form a first conductive trace pattern while maintaining the integrity of the second conductive side of the dielectric layer;

removing said mask from the second conductive side of the dielectric layer and from the first conductive trace pattern;

then 1) masking a second pattern on the second conductive side of the dielectric substrate;

2) masking the first side of the dielectric layer;

then 3) etching the second conductive side of the dielectric layer to form a second conductive trace pattern while maintaining the integrity of the first conductive side of the dielectric layer; and removing said mask from the first conductive side of the dielectric layer and from the first conductive trace pattern.

12. The method of claim 11, further comprising the steps of:

machining the dielectric layer to form a plurality of holes; and depositing graphite in each hole of said plurality.

13. The method of claim 11, wherein at least one of the first and second conductive layers comprise at least one of aluminum, copper and a composite conductive material.

14. The method of claim 13, wherein said composite conductive material comprises at least one of Sn and Pb.

* * * * *